(12) United States Patent
Asaoka et al.

(10) Patent No.: US 10,391,769 B2
(45) Date of Patent: Aug. 27, 2019

(54) LIQUID EJECTING HEAD, LIQUID EJECTING APPARATUS, AND PIEZOELECTRIC DEVICE

(71) Applicant: SEIKO EPSON CORPORATION, Tokyo (JP)

(72) Inventors: Ichiro Asaoka, Suwa (JP); Hiromu Miyazawa, Azumino (JP); Masayuki Omoto, Chino (JP); Toshiki Hara, Suwa (JP); Toshihiro Shimizu, Suwa-gun (JP); Akira Kuriki, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/015,447

(22) Filed: Jun. 22, 2018

(65) Prior Publication Data

US 2018/0370236 A1 Dec. 27, 2018

(30) Foreign Application Priority Data

Jun. 26, 2017 (JP) .................. 2017-124368

(51) Int. Cl.
*B41J 2/14* (2006.01)
*H01L 41/047* (2006.01)
*H01L 41/09* (2006.01)
*H01L 41/187* (2006.01)

(52) U.S. Cl.
CPC ........ *B41J 2/14233* (2013.01); *H01L 41/047* (2013.01); *H01L 41/0973* (2013.01); *B41J 2202/10* (2013.01); *H01L 41/1876* (2013.01)

(58) Field of Classification Search
CPC ................................. B41J 2/14201; B41J 2/14233; B41J 2/14274; B41J 2/14282; B41J 2/14298; B41J 2002/14225; B41J 2002/1425; H01L 41/0973; H01L 41/047; H01L 41/1876
See application file for complete search history.

(56) References Cited

U.S. PATENT DOCUMENTS 7,896,480 B2 * 3/2011 Kazama ............... B41J 2/14233
347/68
7,918,543 B2 * 4/2011 Kazama ............... B41J 2/14233
347/68

(Continued)

FOREIGN PATENT DOCUMENTS

JP 2002-299714 A 10/2002
JP 2008-258575 A 10/2008

*Primary Examiner* — Kristal Feggins
(74) *Attorney, Agent, or Firm* — Workman Nydegger (57) ABSTRACT

Provided is a liquid ejecting head that ejects a liquid in a pressure chamber by a piezoelectric device, the piezoelectric device including a vibration plate, a piezoelectric layer containing lead, a first electrode provided between the vibration plate and the piezoelectric layer, and a second electrode provided on a side opposite to a side of the first electrode as viewed from the piezoelectric layer. The piezoelectric layer is preferentially oriented in a (100) plane, a lattice constant c defined by a crystal plane of the piezoelectric layer parallel to a film surface of the piezoelectric layer and a lattice constant a defined by a crystal plane perpendicular to the film surface satisfy $0.9945 \leq c/a \leq 1.012$, and the thickness of the piezoelectric device is twice or more the thickness t ($t<5$ μm) of the piezoelectric layer.

15 Claims, 9 Drawing Sheets

(56) References Cited

U.S. PATENT DOCUMENTS

| | | | |
|---|---|---|---|
| 9,022,530 B2* | 5/2015 | Ohashi | B41J 2/055 347/68 |
| 2008/0224571 A1 | 9/2008 | Miyazawa et al. | |
| 2011/0148992 A1 | 6/2011 | Miyazawa et al. | |

* cited by examiner

| POLARIZATION DIRECTION | <001> | <111> | <110> |
|---|---|---|---|
| PIEZOELECTRIC CONSTANT $e_{33}$ | 5.0 | 12.7 | 0.0 |

| | ELECTRODE THICKNESS | MEASURED VALUE M1 | | | MEASURED VALUE M2 | | |
|---|---|---|---|---|---|---|---|
| | | C | A | C/A | c | a | c/a |
| MEASUREMENT 1 | 3 | 1.2853 | 1.2862 | 0.9993 | 4.0785 | 4.0814 | 0.9993 |
| MEASUREMENT 2 | 6 | 1.2851 | 1.2868 | 0.9987 | 4.0777 | 4.0832 | 0.9987 |
| MEASUREMENT 3 | 8.5 | 1.2850 | 1.2896 | 0.9964 | 4.0774 | 4.0921 | 0.9964 |
| MEASUREMENT 4 | 20 | 1.2848 | 1.2920 | 0.9945 | 4.0770 | 4.0997 | 0.9945 |
| MEASUREMENT 5 | 50 | 1.2837 | 1.2935 | 0.9924 | 4.0734 | 4.1045 | 0.9924 |
| MEASUREMENT 6 | 20 | 1.2840 | 1.2930 | 0.9930 | 4.0742 | 4.1029 | 0.9930 |
| MEASUREMENT 7 | 0 | 1.2830 | 1.2951 | 0.9907 | 4.0713 | 4.1095 | 0.9907 |
| MEASUREMENT 8 | 0 | 1.2836 | 1.2951 | 0.9912 | 4.0732 | 4.1094 | 0.9912 |

LIQUID EJECTING HEAD, LIQUID EJECTING APPARATUS, AND PIEZOELECTRIC DEVICE

The entire disclosure of Japanese Patent Application No. 2017-124368, filed Jun. 26, 2017 is expressly incorporated by reference herein.

BACKGROUND

1. Technical Field

The present invention relates to a liquid ejecting head, a liquid ejecting apparatus, and a piezoelectric device.

2. Related Art

To date, a liquid ejecting head that ejects a liquid such as ink that has filled a pressure chamber has been proposed. For example, JP-A-2008-258575 and JP-A-2002-299714 disclose a liquid ejecting head that ejects a liquid by vibrating a vibration plate constituting a wall surface of a pressure chamber by using a piezoelectric element.

In order to improve the performance of a liquid ejecting head, it is very important to improve the performance of a piezoelectric device including a piezoelectric element and a vibration plate.

SUMMARY

An advantage of some aspects of the invention is that a piezoelectric device with improved performance is provided.

First Aspect

A liquid ejecting head according to a preferable aspect (first aspect) of the invention is a liquid ejecting head that ejects a liquid in a pressure chamber by a piezoelectric device, the piezoelectric device including a vibration plate, a piezoelectric layer containing lead, a first electrode provided between the vibration plate and the piezoelectric layer, and a second electrode provided on a side opposite to a side of the first electrode as viewed from the piezoelectric layer. The piezoelectric layer is preferentially oriented in a (100) plane, a lattice constant c defined by a crystal plane of the piezoelectric layer parallel to a film surface of the piezoelectric layer and a lattice constant a defined by a crystal plane perpendicular to the film surface satisfy $0.9945 \leq c/a \leq 1.012$, and a thickness of the piezoelectric device is twice or more a thickness t ($t < 5$ μm) of the piezoelectric layer. In the above first aspect, the lattice constant c defined by the crystal plane of the piezoelectric layer parallel to a film surface of the piezoelectric layer and the lattice constant a defined by the crystal plane perpendicular to the film surface satisfy $0.9945 \leq c/a \leq 1.012$. Therefore, compared with a configuration that does not satisfy the above-mentioned conditions, it is possible to improve the performance of the piezoelectric device. In addition, because a thickness T of the piezoelectric device is twice or more the thickness t of the piezoelectric layer, the neutral plane of the piezoelectric device is located outside the piezoelectric layer. Therefore, it is possible to efficiently displace the piezoelectric layer as compared with a structure in which the neutral plane is located inside the piezoelectric layer.

Second Aspect

In a preferable example (second aspect) of the first aspect, the lattice constant c and the lattice constant a may satisfy $c/a > 0.996$. According to the above configuration, the effect that the performance of the piezoelectric device can be improved is marked.

Third Aspect

In a preferable example (third aspect) of the first or second aspect, for the piezoelectric device formed outside the pressure chamber (for example, a dummy piezoelectric device not contributing to liquid ejection), the lattice constant c and the lattice constant a may satisfy $c/a \leq 0.996$.

Fourth Aspect

In a preferable example (fourth aspect) of any one of the first to the third aspects, for a portion of the piezoelectric layer located on a side opposite to a side of the pressure chamber as viewed from the neutral plane of the piezoelectric device, the lattice constant c and the lattice constant a may satisfy $0.9945 \leq c/a \leq 1.012$. According to the above aspect, it is possible to efficiently deform the vibration plate.

Fifth Aspect

A liquid ejecting head according to an another aspect (fifth aspect) of the invention is a liquid ejecting head that ejects a liquid in a pressure chamber by a piezoelectric device, the piezoelectric device including a vibration plate, a piezoelectric layer containing lead, a first electrode provided between the vibration plate and the piezoelectric layer, and a second electrode provided on a side opposite to a side of the first electrode from the piezoelectric layer. A spacing C between lattice planes of a crystal of the piezoelectric layer parallel to a film surface of the piezoelectric layer and a spacing A between lattice planes perpendicular to the film surface satisfy $0.9945 \leq C/A \leq 1.012$, and a thickness of the piezoelectric device is twice or more a thickness t ($t < 5$ μm) of the piezoelectric layer. In the above aspect, because the spacing C between the lattice planes of the crystal of the piezoelectric layer parallel to the film surface of the piezoelectric layer and the spacing A between the lattice planes perpendicular to the film surface satisfy $0.9945 \leq C/A \leq 1.012$, the polarization direction of the piezoelectric layer is maintained at <111>. Therefore, compared with a configuration that does not satisfy the above-mentioned conditions, it is possible to improve the performance of the piezoelectric device. In addition, because a thickness T of the piezoelectric device is twice or more the thickness t of the piezoelectric layer, the neutral plane of the piezoelectric device is located outside the piezoelectric layer. Therefore, it is possible to efficiently displace the piezoelectric layer as compared with a structure in which the neutral plane is located inside the piezoelectric layer.

Sixth Aspect

In a preferable example (sixth aspect) of any one of the first to fifth aspects, the thickness of the piezoelectric device may be 6 t or less. In this case, it is possible to reduce stress acting on the piezoelectric layer (for example, stress in a state where no voltage is being applied).

Seventh Aspect

In a preferable example (seventh aspect) of any one of the first to sixth aspects, the vibration plate may contain $ZrO_2$.

Eighth Aspect

A liquid ejecting apparatus according to a preferable aspect (eighth aspect) of the invention includes the liquid ejecting head according to any one of the first to seventh aspects of the invention. An example of the liquid ejecting apparatus is a printing apparatus that ejects ink, however, the usage of the liquid ejecting apparatus according to the invention is not limited to printing.

Ninth Aspect

A piezoelectric device according to a preferable aspect (ninth aspect) of the invention includes a vibration plate, a piezoelectric layer containing lead, a first electrode provided between the vibration plate and the piezoelectric layer, and a second electrode provided on a side opposite to a side of the first electrode as viewed from the piezoelectric layer. The piezoelectric layer is preferentially oriented in a (100) plane, a lattice constant c defined by a crystal plane of the piezoelectric layer parallel to a film surface of the piezoelectric layer and a lattice constant a defined by a crystal plane perpendicular to the film surface satisfy $0.9945 \leq c/a \leq 1.012$, and a thickness of the piezoelectric device is twice or more a thickness t (t<5 μm) of the piezoelectric layer. In the above aspect, the lattice constant c defined by the crystal plane of the piezoelectric layer parallel to the film surface of the piezoelectric layer and the lattice constant a defined by the crystal plane perpendicular to the film surface satisfy $0.9945 \leq c/a \leq 1.012$. Therefore, compared with a configuration that does not satisfy the above-mentioned conditions, it is possible to improve the performance of the piezoelectric device. In addition, because a thickness T of the piezoelectric device is twice or more the thickness t of the piezoelectric layer, the neutral plane of the piezoelectric device is located outside the piezoelectric layer. Therefore, it is possible to efficiently displace the piezoelectric layer as compared with a structure in which the neutral plane is located inside the piezoelectric layer.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
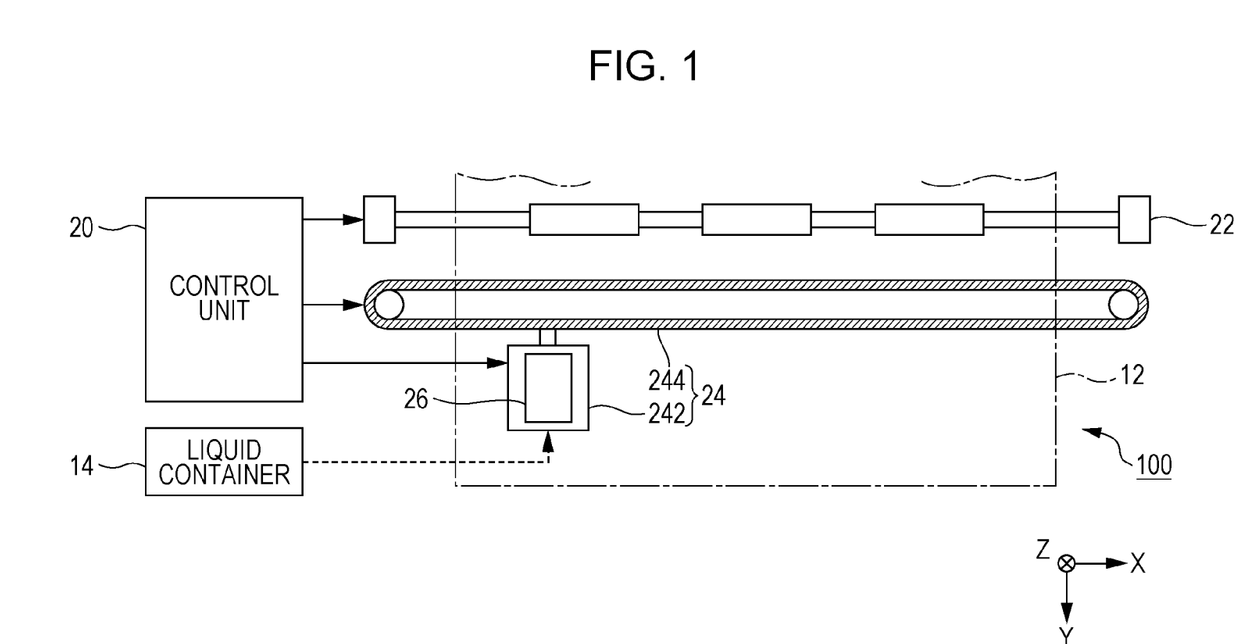
FIG. 1 is a structural diagram of a liquid ejecting apparatus according to a preferred embodiment of the invention.

FIG. 1 is a structural diagram of a liquid ejecting apparatus 100 according to a preferred embodiment of the invention. The liquid ejecting apparatus 100 according to this embodiment is an ink jet type printing apparatus that ejects ink, which is an example of a liquid, onto a medium 12. Typically, the medium 12 is printing paper, but a printing target composed of any material such as a resin film or cloth can be used as the medium 12. As illustrated in FIG. 1, the liquid ejecting apparatus 100 is provided with a liquid container 14 that stores ink. For example, a cartridge removably attached to the liquid ejecting apparatus 100, a bag-shaped ink pack formed of a flexible film, or an ink tank capable of replenishing ink is used as the liquid container 14.

As illustrated in FIG. 1, the liquid ejecting apparatus 100 includes a control unit 20, a transport mechanism 22, a movement mechanism 24, and a liquid ejecting head 26. The control unit 20 includes, for example, a processing circuit such as a central processing unit (CPU) or field programmable gate array (FPGA) and a memory circuit such as a semiconductor memory, and integrally controls each component of the liquid ejecting apparatus 100. The transport mechanism 22 transports the medium 12 in the Y direction under the control of the control unit 20.

The movement mechanism 24 reciprocates the liquid ejecting head 26 in the X direction under the control of the control unit 20. The X direction is a direction intersecting (typically orthogonal to) the Y direction in which the medium 12 is transported. The movement mechanism 24 according to this embodiment includes a transport body 242 (carriage), which is substantially box-shaped and which houses the liquid ejecting head 26, and a transport belt 244 to which the transport body 242 is fixed. Further, a configuration in which a plurality of liquid ejecting heads 26 are mounted on the transport body 242 or a configuration in which the liquid container 14 is mounted on the transport body 242 together with the liquid ejecting heads 26 may be adopted.

Each of the liquid ejecting heads 26 ejects ink supplied from the liquid container 14 onto the medium 12 from a plurality of nozzles (ejection holes) under the control of the control unit 20. A desired image is formed on the surface of the medium 12 by each of the liquid ejecting heads 26 ejecting ink onto the medium 12 in parallel with the transport of the medium 12 by the transport mechanism 22 and the repetitive reciprocation of the transport body 242. Further, the direction perpendicular to the XY plane (for example, the plane which is parallel to the surface of the medium 12) is hereinafter referred to as the Z direction. The direction of ejection of ink by each of the liquid ejecting heads 26 (typically the vertical direction) corresponds to the Z direction.

Figure 2:
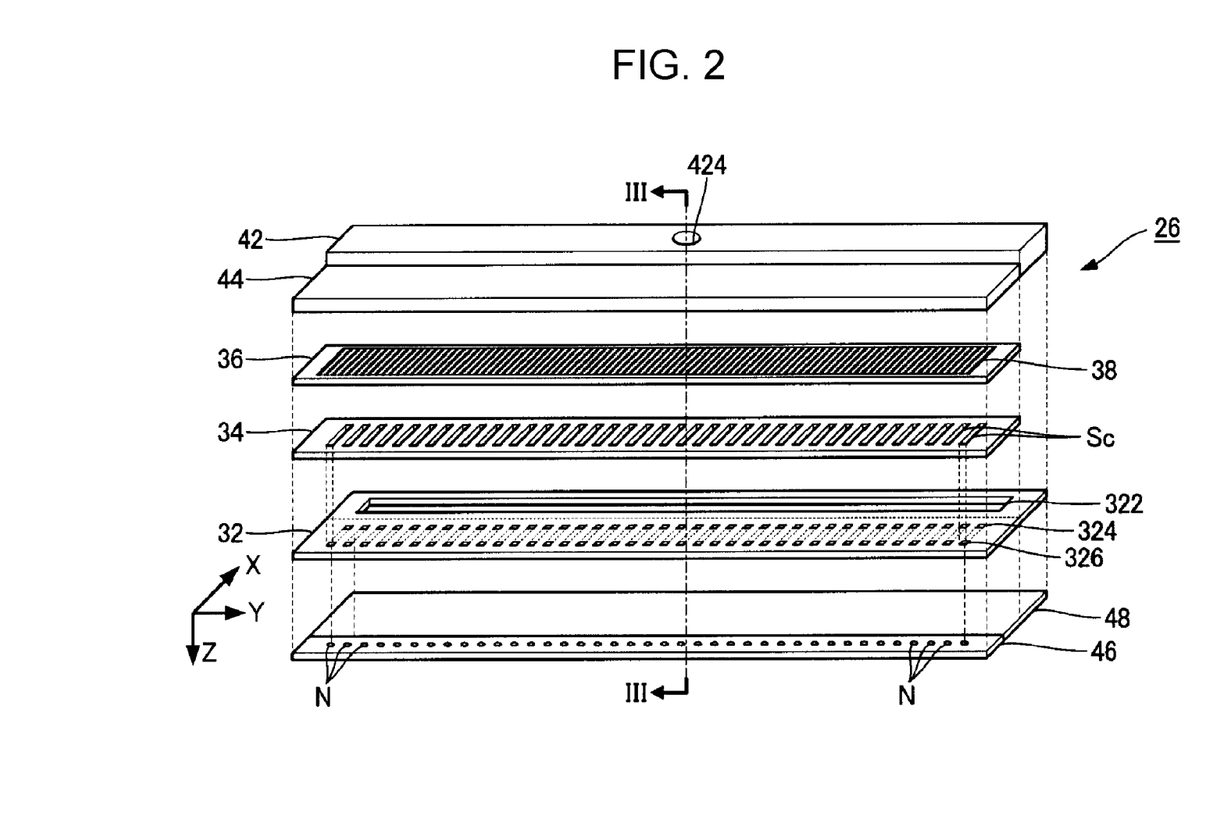
FIG. 2 is an exploded perspective view of a liquid ejecting head.
Figure 3:
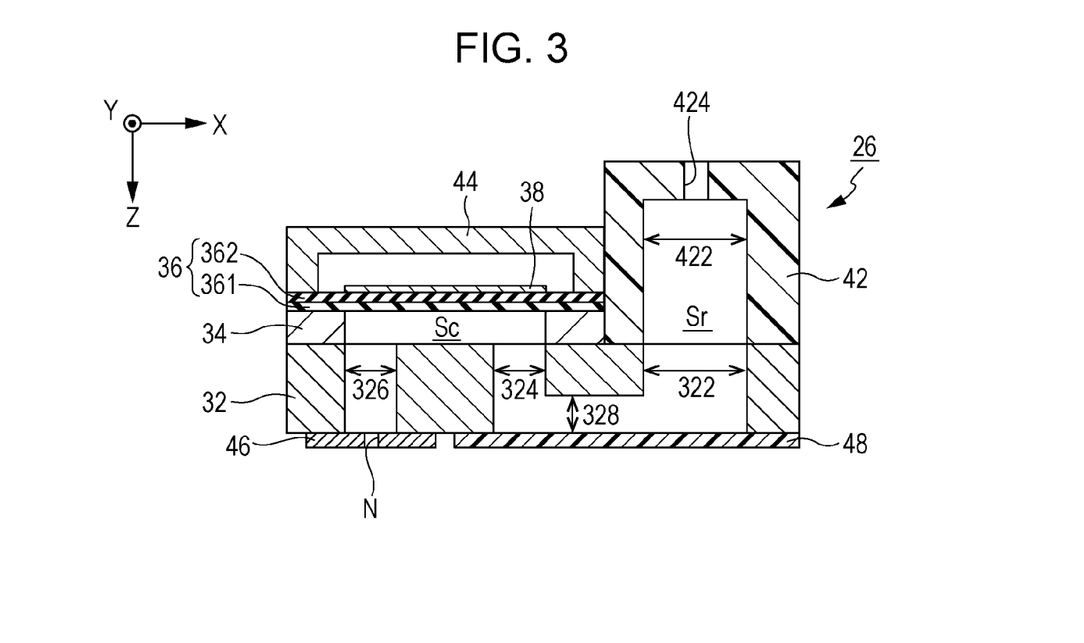
FIG. 3 is a cross-sectional view of the liquid ejecting head (cross-sectional view taken along the line III-III in FIG. 2).

FIG. 2 is an exploded perspective view of the liquid ejecting head 26, and FIG. 3 is a cross-sectional view taken along the line III-III in FIG. 2 (a cross section parallel to the XZ plane). As illustrated in FIG. 2 and FIG. 3, the liquid ejecting head 26 includes a flow path substrate 32 that is substantially rectangular and elongated in the Y direction. A pressure chamber substrate 34, a vibration plate 36, a plurality of piezoelectric elements 38, a housing portion 42, and a sealing body 44 are installed on the surface of the flow path substrate 32 on the negative side in the Z direction. On the other hand, a nozzle plate 46 and a vibration absorber 48 are installed on the surface of the flow path substrate 32 on the positive side in the Z direction. The elements of the liquid ejecting head 26 are each roughly a plate-shaped member elongated in the Y direction like the flow path substrate 32 and are joined to each other using, for example, an adhesive.

As illustrated in FIG. 2, the nozzle plate 46 is a plate-like member formed with a plurality of nozzles N arranged in the Y direction. Each of the nozzles N is a hole that allows ink to pass therethrough. Further, the flow path substrate 32, the pressure chamber substrate 34, and the nozzle plate 46 are formed by processing a single-crystal substrate of, for example, silicon (Si) by a semiconductor manufacturing technique such as etching. However, the material and the manufacturing method of each element of the liquid ejecting head 26 are arbitrary. The Y direction can also be said to be a direction in which a plurality of the nozzles N are arranged.

The flow path substrate 32 is a plate member that forms a flow path of ink. As illustrated in FIG. 2 and FIG. 3, an opening 322, a supply flow path 324, and a communication flow path 326 are formed in the flow path substrate 32. The opening 322 is a through-hole that is formed in an elongated shape along the Y direction in plan view (that is, viewed from the Z direction) so as to be continuous along the plurality of the nozzles N. On the other hand, the supply flow path 324 and the communication flow path 326 are through holes formed individually for each of the nozzles N. In addition, as illustrated in FIG. 3, a relay flow path 328 extending across a plurality of supply flow paths 324 is formed on the surface of the flow path substrate 32 on the positive side in the Z direction. The relay flow path 328 is a flow path that enables the opening 322 and the plurality of supply flow paths 324 to communicate with each other.

The housing portion 42 is, for example, a structure manufactured by injection molding of a resin material and is fixed to the surface of the flow path substrate 32 on the negative side in the Z direction. As illustrated in FIG. 3, a housing section 422 and an inlet hole 424 are formed in the housing portion 42. The housing section 422 is a recessed portion having an outer shape corresponding to the opening 322 of the flow path substrate 32 and the inlet hole 424 is a through hole that communicates with the housing section 422. As understood from FIG. 3, the space in which the opening 322 of the flow path substrate 32 and the housing section 422 of the housing portion 42 communicate with each other functions as a liquid storage chamber (reservoir) Sr. The ink that has been supplied from the liquid container 14 and passed through the inlet hole 424 is stored in the liquid storage chamber Sr.

The vibration absorber 48 is an element for absorbing pressure fluctuation in the liquid storage chamber Sr, and is configured to include, for example, a flexible sheet member (compliance substrate) that can be elastically deformed. More specifically, the vibration absorber 48 is installed on the surface of the flow path substrate 32 on the positive side in the Z direction in such a manner as to close the opening 322 of the flow path substrate 32, the relay flow path 328, and the plurality of supply flow paths 324 and to form the bottom surface of the liquid storage chamber Sr.

As illustrated in FIG. 2 and FIG. 3, the pressure chamber substrate 34 is a plate-like member in which a plurality of pressure chambers Sc corresponding to different ones of the nozzles N are formed. The plurality of the pressure chambers Sc are arranged along the Y direction. Each of the pressure chambers (cavities) Sc is an opening elongated in the X direction in plan view. The end portion of the pressure chamber Sc on the positive side in the X direction overlaps with one of the supply flow paths 324 of the flow path substrate 32 in plan view, and the end portion of the pressure chamber Sc on the negative side in the X direction overlaps with a corresponding communication flow path 326 of the flow path substrate 32 in plan view.

The vibration plate 36 (an example of a vibration portion) is installed on the surface of the pressure chamber substrate 34 on the side opposite to the side of the flow path substrate 32. The vibration plate 36 is an elastically vibratable plate member. As illustrated in FIG. 3, the vibration plate 36 of this embodiment is formed by stacking a first layer 361 and a second layer 362. The second layer 362, when viewed from the first layer 361, is positioned on the side opposite to the side of the pressure chamber substrate 34. The first layer 361 is an elastic film formed of an elastic material such as silicon oxide ($SiO_2$), and the second layer 362 is an insulating film formed of an insulating material such as zirconium oxide ($ZrO_2$). Further, it is also possible to integrally form the pressure chamber substrate 34 and a portion or the whole of the vibration plate 36 by selectively removing a portion of a plate-shaped member having a predetermined plate thickness in the plate thickness direction in accordance with the area corresponding to the pressure chamber Sc.

As understood from FIG. 3, the flow path substrate 32 and the vibration plate 36 oppose each other inside each of the pressure chambers Sc with a space therebetween. The pressure chamber Sc is located between the flow path substrate 32 and the vibration plate 36 and is a space for applying pressure to the ink filled in the pressure chamber Sc. The ink stored in the liquid storage chamber Sr branches from the relay flow path 328 into each of the supply flow paths 324 and is supplied and filled in parallel to the plurality of the pressure chambers Sc. As understood from the above description, the vibration plate 36 constitutes the wall surface of the pressure chamber Sc (specifically, the upper surface which is one surface of the pressure chamber Sc).

As illustrated in FIG. 2 and FIG. 3, a plurality of piezoelectric elements 38 that correspond to different ones of the nozzles N (or pressure chambers Sc) are installed on a surface of the vibration plate 36 (that is, the surface of the second layer 362) on the side opposite to the side of the pressure chamber Sc. Each of the piezoelectric elements 38 is a passive element that deforms when a drive signal is supplied thereto, and is formed in an elongated shape in the X direction in plan view. The plurality of the piezoelectric elements 38 are arranged in the Y direction so as to correspond to the plurality of the pressure chambers Sc. When the vibration plate 36 vibrates in conjunction with the deformation of the piezoelectric element 38, the pressure in the pressure chamber Sc changes and consequently the ink filled in the pressure chamber Sc passes through the communication flow path 326 and the nozzle N and is ejected. Further, in the following description, the structure including the vibration plate 36 and the piezoelectric element 38 may be referred to as "piezoelectric device" in some cases. The piezoelectric device is an actuator for changing the internal pressure of the pressure chamber Sc.

The sealing body 44 of FIG. 2 and FIG. 3 is a structure that protects the plurality of the piezoelectric elements 38 and reinforces the mechanical strength of the pressure chamber substrate 34 and the vibration plate 36 and is fixed to the surface of the vibration plate 36, for example, with an adhesive. The plurality of the piezoelectric elements 38 are housed inside recessed portions formed on a surface of the sealing body 44 facing the vibration plate 36.

Figure 4:
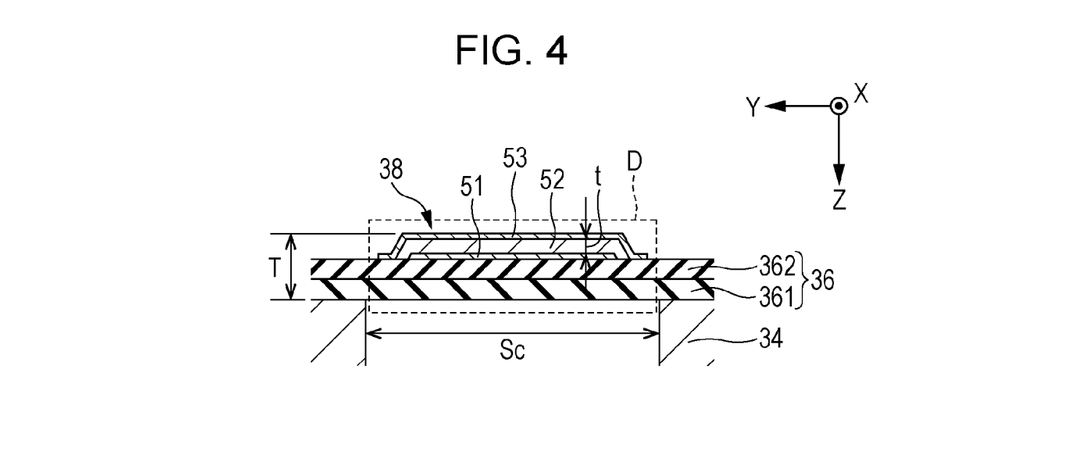
FIG. 4 is a cross-sectional view of a piezoelectric element.

FIG. 4 is a cross-sectional view of one arbitrary piezoelectric device D. A cross section perpendicular to the X direction (that is, a cross section perpendicular to the longitudinal direction of the piezoelectric element 38) is illustrated in FIG. 4. As illustrated in FIG. 4, each of the piezoelectric elements 38 is a structure in which a first electrode 51, a piezoelectric layer 52, and a second electrode 53 are stacked.

The first electrode 51 is a conductive film formed between the vibration plate 36 and the piezoelectric layer 52. Specifically, the first electrode 51 is formed on a surface of the vibration plate 36 (more specifically, the surface of the second layer 362). The second electrode 53 is a conductive film formed on the side opposite to the side of the first electrode 51 when viewed from the piezoelectric layer 52. Further, one of the first electrode 51 and the second electrode 53 is formed individually for each of the piezoelectric devices D and the other one of the first electrode 51 and the second electrode 53 is continuously formed over the plurality of the piezoelectric devices D. However, both of the first electrode 51 and the second electrode 53 may be separately formed for each of the piezoelectric devices D.

The piezoelectric layer 52 is a thin film formed of a piezoelectric material containing lead (Pb). Specifically, a ferroelectric crystal film having a perovskite crystal structure is suitable as the piezoelectric layer 52. For example, lead zirconate titanate (Pb (Zr, Ti)$O_3$:PZT) or lead zirconate titanate niobate (Pb (Zr, Ti, Nb)$O_3$:PZTN) is exemplified as the material of the piezoelectric layer 52. The piezoelectric layer 52 of this embodiment is preferentially oriented in the (100) plane. Here, "preferentially oriented" means that the proportion of crystals oriented in the (100) plane exceeds the proportion of crystals oriented in other crystal planes such as the (110) and (111) planes. The thickness t of the piezoelectric layer 52 is, for example, less than 5 μm (t<5 μm). According to the configuration in which the thickness t of the piezoelectric layer 52 is less than 5 μm as described above, there is an advantage that cracking of the piezoelectric layer 52 can be suppressed.

Thickness T of the Piezoelectric Device

The thickness T of the piezoelectric device D will now be focused on. The thickness T is the overall size of the piezoelectric device D in the Z direction. Specifically, the spacing between the surface of the first layer 361 of the vibration plate 36 on the pressure chamber Sc side (that is, the lowermost surface of the piezoelectric device D) and the surface of the second electrode 53 of the piezoelectric element 38 (that is, the uppermost surface of the piezoelectric device D) is equivalent to the thickness T of the piezoelectric device D. The thickness T of the piezoelectric device D in this embodiment is twice or more the thickness t of the piezoelectric layer 52 (T≥2t). According to the above configuration, the neutral plane of the piezoelectric device D (that is, the imaginary plane in which neither tensile strain nor compressive strain occurs) is located outside the piezoelectric layer 52 (specifically, inside the vibration plate 36). Therefore, it is possible to efficiently deform the piezoelectric layer 52.

Figure 5:
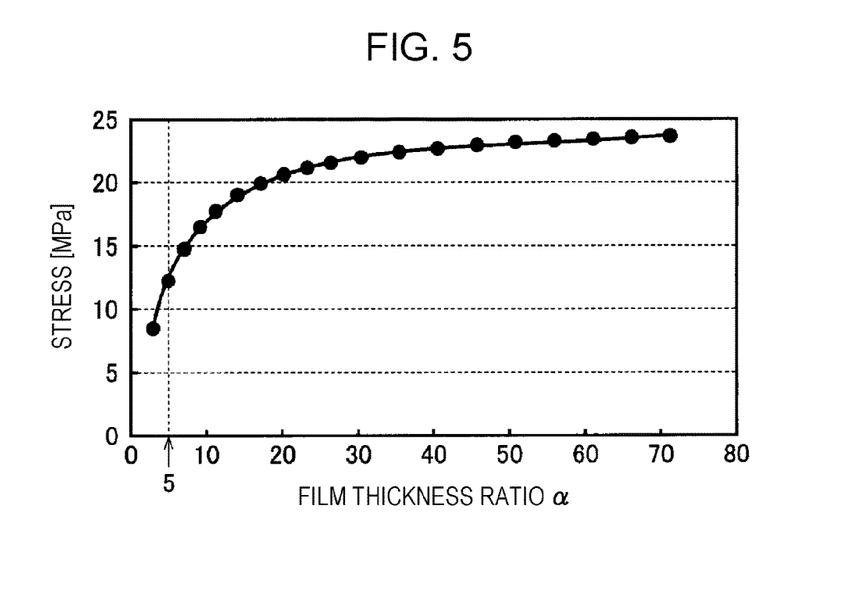
FIG. 5 is a graph showing the relationship between the film thickness ratio between a piezoelectric layer and a vibration plate and the stress generated inside the piezoelectric layer.

FIG. 5 is a graph showing the relationship between the ratio α of the thickness of the vibration plate 36 and the thickness t of the piezoelectric layer 52 (hereinafter referred to as "film thickness ratio") and stress (specifically, tensile stress). In the observation of FIG. 5, assuming a situation where a tensile stress of about 25 MPa is initially applied to the piezoelectric layer 52 on the surface of the vibration plate 36 composed of a single layer of silicon oxide ($SiO_2$), the stress of the piezoelectric layer 52 was measured by the finite element method.

As understood from FIG. 5, as the film thickness ratio α decreases (that is, the thickness of the vibration plate 36 becomes smaller than the thickness t of the piezoelectric layer 52), the stress acting on the piezoelectric layer 52 decreases. In order to set the stress acting on the piezoelectric layer 52 to a half of a typical numerical value (25 MPa), it is necessary to set the film thickness ratio α to 5 or less. That is, it is preferable that the thickness T of the piezoelectric device D including the vibration plate 36 and the piezoelectric layer 52 be set to 6 times or less the thickness t of the piezoelectric layer 52 (T≤6t). According to the above configuration, it is possible to reduce stress acting initially on the piezoelectric layer 52 (for example, stress in a state where no voltage is being applied).

Crystal Structure of the Piezoelectric Layer 52

The polarization direction of the piezoelectric layer 52 will be described. In the following description, the polarization direction of the perovskite type crystal structure represented by the chemical formula $ABO_3$ is defined as follows. First, attention is paid to the direction in which the B site atoms are displaced with respect to the pseudo-cubic (pseudocubic crystal) centro-symmetric position (neutral point).

When the polarization direction P is <111>, it means that the B site atoms are displaced and stabilized in the <111> direction.

When the polarization direction P is <110>, it means that the B site atoms are displaced and stabilized in the <110> direction.

When the polarization direction P is <001>, it means that the B site atoms are displaced and stabilized in the <001> direction.

However, the displacement of the B site atoms is considered to be the average value for the B site atoms in the thin film. Therefore, some B site atoms may be displaced in directions of different Miller indices.

Figure 6:
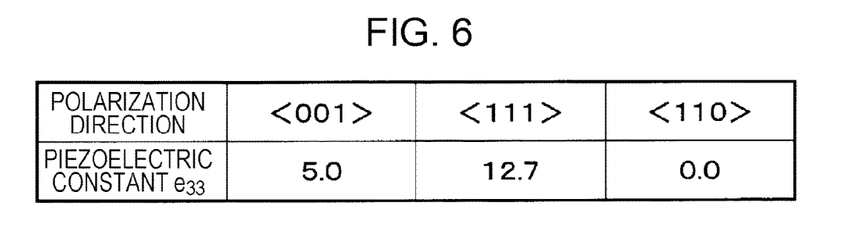
FIG. 6 is a chart showing the relationship between the polarization direction of the piezoelectric layer and the performance of the piezoelectric layer.

From the viewpoint of improving the performance of the piezoelectric device D, the crystal structure of the piezoelectric layer 52 is examined. FIG. 6 is a chart showing the relationship between the polarization direction of the piezoelectric layer 52 and the performance of the piezoelectric layer 52 (hereinafter referred to as "piezoelectric performance"). Here, it is assumed that the applied voltage faces <001> in pseudo-cubic display. This corresponds to, for example, the applied voltage being oriented in a direction perpendicular to the film surface in the perovskite type crystal structure oriented in the (100) plane. The piezoelectric constant $e_{33}$ (C/m$^2$) is exemplified in FIG. 6 as an index of piezoelectric performance. As understood from FIG. 6, when the polarization direction of the piezoelectric layer 52 is <111>, the piezoelectric performance is maximized. Therefore, from the viewpoint of improving the performance of the piezoelectric device D, a configuration in which the polarization direction of the piezoelectric layer 52 is maintained at <111> is preferable.

Figure 8:
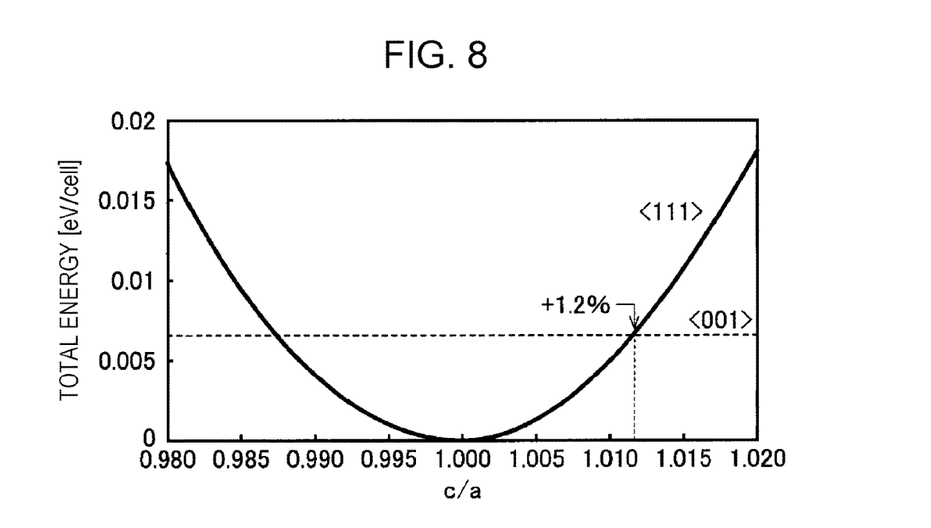
FIG. 8 is a graph showing the relationship between a lattice constant ratio of a crystal of the piezoelectric layer and the total energy of the electron system in the piezoelectric layer.
Figure 9:
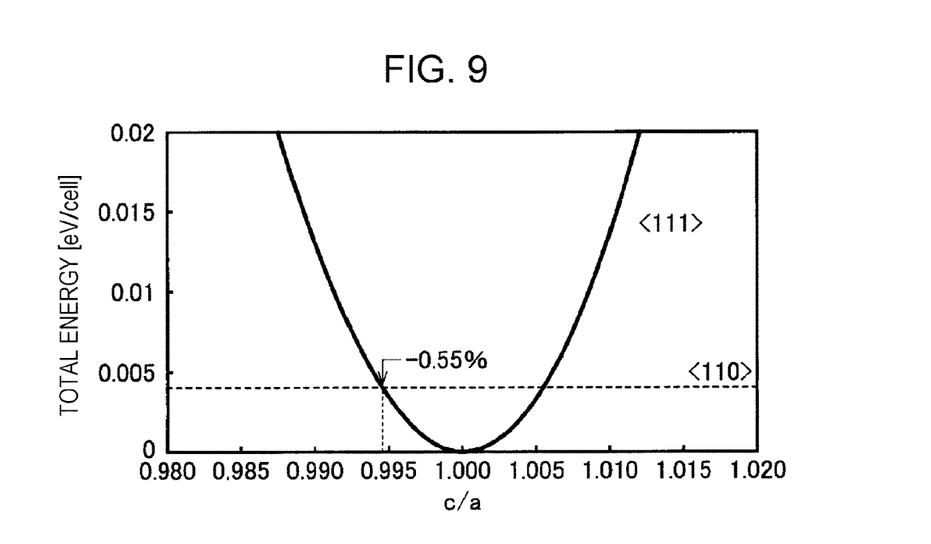
FIG. 9 is a graph showing the relationship between the lattice constant ratio of a crystal of the piezoelectric layer and the total energy of the electron system in the piezoelectric layer.

Here, attention is paid to the lattice constant c defined by the crystal plane parallel to the film surface of the piezoelectric layer 52 and the lattice constant a defined by the crystal plane perpendicular to the film surface of the piezoelectric layer 52. The film surface is the upper surface or the lower surface of the piezoelectric layer 52. FIG. 8 and FIG. 9 are graphs each showing the relationship between the ratio c/a of the lattice constant c to the lattice constant a of the crystal of the piezoelectric layer 52 (hereinafter referred to as "lattice constant ratio") and the energy in the piezoelectric layer 52. In FIG. 8, a change in energy when the piezoelectric layer 52 is expanded or contracted in a direction perpendicular to the film surface (direction of the lattice constant c) is illustrated, and, in FIG. 9, a change in energy when the piezoelectric layer 52 is expanded or contracted in a direction parallel to the film surface (direction of the lattice constant a) is illustrated.

For the calculations in FIGS. 6, 8 and 9, we used solid first principles calculation. In particular, the total energy of the electron system was calculated within the range of local density approximation by the density functional theory method. VASP (Vienna Ab-initio Simulation Package; G. Kresse and J. Furthmuller, Phys. Rev. B 54, 11169 (1996)) was used as the calculation code. In addition, the linear response theory was applied to the calculation of the piezoelectric constant $e_{33}$. For the actual calculation, we used the Earth Simulator of the Japan Ocean Research and Development Organization. We also assumed that the perovskite crystal structure of $ABO_3$ was 2×2×2 supercells by setting the k-point mesh of reciprocal lattice spacing to (3×3×3). Other conditions related to the calculation are as follows.
Energy cutoff: 400 eV
Convergence range of energy: $1 \times 10^{-7}$ eV or less
Convergence range of forces acting on atoms: 0.001 eV/A FIG. 8 is a graph showing how the total energy of the electron system changes when the lattice constant ratio c/a is changed by extending the lattice constant c. In addition, FIG. 9 is a graph showing how the total energy of the electron system changes when the lattice constant ratio c/a is changed by extending the lattice constant a. In both FIG. 8 and FIG. 9, the vertical axis represents the total energy of the electron system per cell of $ABO_3$.

As understood from FIG. 8, in the case where the piezoelectric layer 52 is extended in the direction of the lattice constant c, when the lattice constant ratio c/a reaches +1.2%, it is probable that the polarization direction of the piezoelectric layer 52 will rotate from <111> to <001>. That is, the total energy of the electron system becomes lower and stabilizes for the polarization direction <001> than for the polarization direction <111>. Therefore, in order to maintain the polarization direction at <111>, it is necessary to set the lattice constant ratio c/a to 1.012 or less.

As understood from FIG. 9, in the case where the piezoelectric layer 52 is elongated in the direction of the lattice constant a, when the lattice constant ratio c/a reaches −0.55%, it is probable that the polarization direction of the piezoelectric layer 52 will rotate from <111> to <110>. That is, the total energy of the electron system becomes lower and stabilizes for the polarization direction <110> rather than for the polarization direction <111>. Therefore, in order to maintain the polarization direction at <111>, it is necessary to set the lattice constant ratio c/a to 0.9945 or more.

As understood from the above description, from the viewpoint of securing high piezoelectric performance by maintaining the polarization direction at <111>, it is preferable that the lattice constant a and the lattice constant c of a crystal of the piezoelectric layer 52 satisfy the relationship of the following numerical formula (1).

$$0.9945 \leq c/a \leq 1.012 \tag{1}$$

Figure 10:
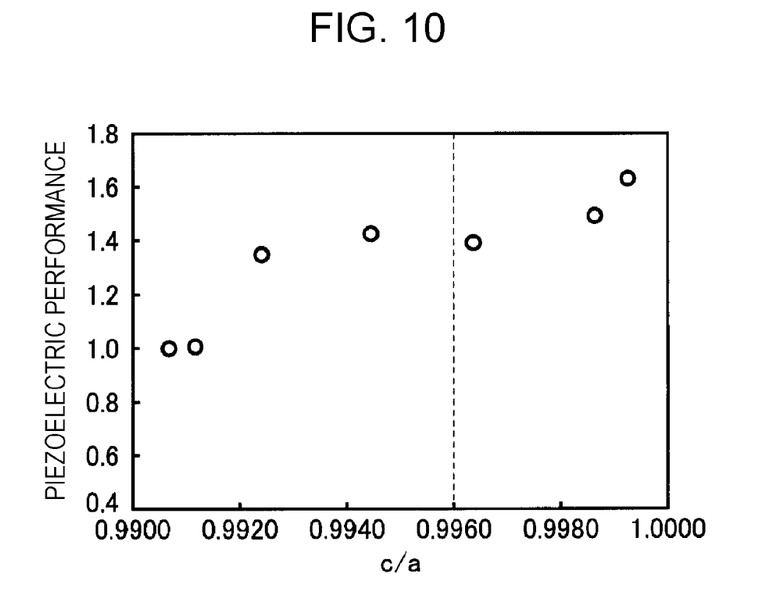
FIG. 10 is a graph showing the relationship between the lattice constant ratio and piezoelectric performance of a piezoelectric device.

A further preferable range of the lattice constant ratio c/a is further investigated. FIG. 10 is a graph showing the relationship between the lattice constant ratio c/a of the piezoelectric device D and the piezoelectric performance. On the vertical axis of FIG. 10, the piezoelectric constant normalized so that a specific numerical value becomes a reference value (that is, 1) is expressed as an index of piezoelectric performance.

Referring to FIG. 10, it can be confirmed that the piezoelectric performance is particularly improved when the lattice constant ratio c/a is more than 0.996. Therefore, as expressed by the following numerical formula (2), a range in which the lattice constant ratio c/a exceeds 0.996 within the range of the formula (1) is particularly preferable.

$$0.996 < c/a \leq 1.012 \tag{2}$$

Figure 7:
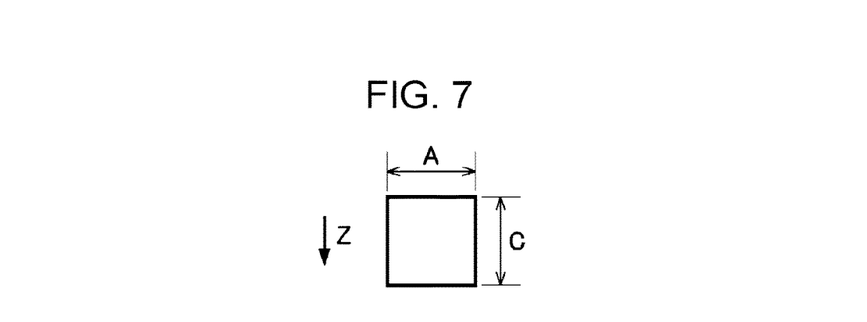
FIG. 7 is an explanatory diagram of a lattice spacing ratio in crystals of the piezoelectric layer.

Here, as illustrated in FIG. 7, attention is paid to a spacing C between the lattice planes of the piezoelectric layer 52 parallel to the film surface of the piezoelectric layer 52 and a spacing A between the lattice planes perpendicular to the film surface. The film surface is the upper surface or the lower surface of the piezoelectric layer 52 as described above. The spacing C is the spacing between the lattice planes perpendicular to the Z direction (that is, the spacing between two mutually adjacent lattice planes in the Z direction) and the spacing A is the spacing between the lattice planes parallel to the Z direction. Assuming a configuration in which the piezoelectric layer 52 is preferentially oriented in the (100) plane, the lattice constant ratio c/a described above is equivalent to the ratio of the spacing C between the lattice planes parallel to the film surface of the piezoelectric layer 52 and the spacing A between the lattice planes perpendicular to the film surface (hereinafter referred to as "lattice spacing ratio"). Focusing on the lattice spacing ratio C/A of the crystal of the piezoelectric layer 52, the above formula (1) is also expressed by the following numerical expression (1a), and the above expression (2) can also be expressed by the following expression (2a).

$$0.9945 \leq C/A \leq 1.012 \tag{1a}$$

$$0.996 < C/A \leq 1.012 \tag{2a}$$

Further, as understood from FIG. 8 and FIG. 9, as the lattice constant ratio c/a approaches 1, the piezoelectric layer 52 tends to be more stable in terms of energy. Considering the above tendency, in order to maintain the polarization direction of the piezoelectric layer 52 at <111>, it is particularly preferable for the lattice constant ratio c/a to be close to 1 within the range of the formula (1) or the formula (2).

The conditional expressions of the formulas (1) and (2) (furthermore, the formulas (1a) and (2a)) are not necessarily required to be established over the entire piezoelectric layer 52 in the thickness direction. Specifically, it is desirable that the above conditional expressions hold for a portion of the piezoelectric layer 52 located on the side (upper side) opposite to the side of the pressure chamber Sc when viewed from the neutral plane of the piezoelectric device D. For example, it is desirable that one-third of the portion of the piezoelectric layer 52 located on the second electrode 53 side in the film thickness direction satisfy the above conditional expressions. According to the above configuration, it is possible to make the piezoelectric displacement at a position far from the neutral plane contribute to deformation of the vibration plate structure through a larger moment of force.

Measurement of Lattice Constant Ratio c/a

Figure 11:
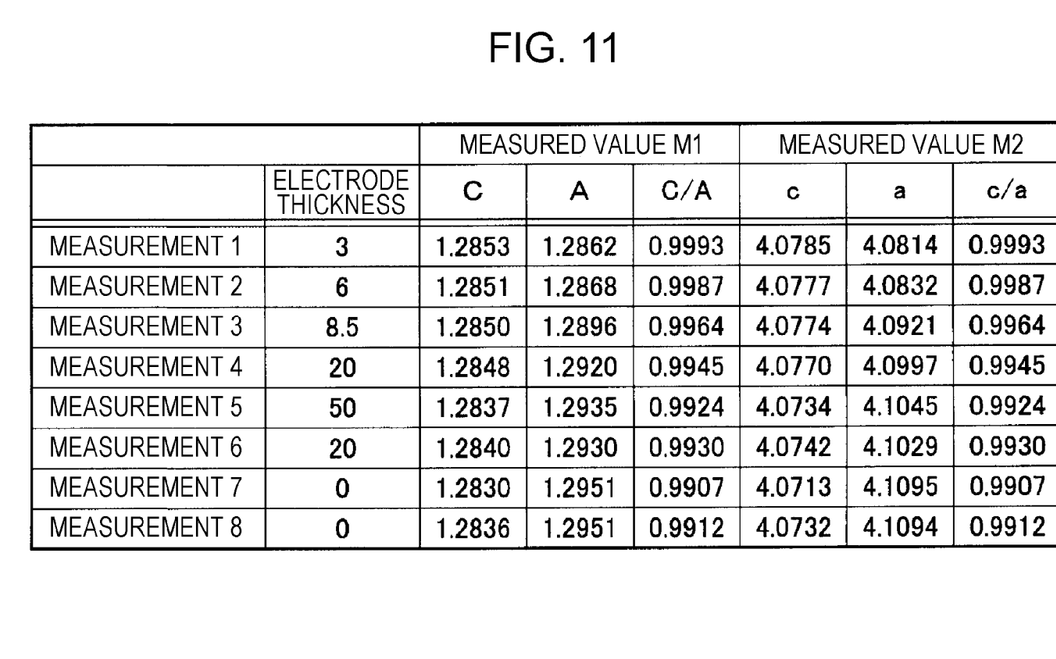
FIG. 11 is a chart of measured lattice spacing ratios.

In the observation explained above, as illustrated in FIG. 11, for a state in which the pressure chamber Sc has not been formed in the pressure chamber substrate 34 (hereinafter referred to as "before formation of the pressure chamber") and a state in which the pressure chamber Sc has been formed (hereinafter referred to as "after formation of the pressure chamber"), the spacing C and the spacing A of the samples and the lattice spacing ratio C/A were measured (measured value M1). Specifically, measurement 1 to measurement 6 illustrated in FIG. 11 are the measurement results of the samples after formation of the pressure chamber, and measurement 7 and measurement 8 are the measurement results of the samples before the formation of the pressure chamber. In addition, the lattice constant ratio c/a was measured for a plurality of cases where the film thickness of the second electrode 53 was different. Further, measurement 1 to measurement 5 are measurement results for a region (membrane) located inside the pressure chamber Sc in plan view of the piezoelectric device D. On the other hand, measurement 6 is a measurement result for an area of the piezoelectric device D located outside the pressure chamber Sc in plan view for a configuration in which the piezoelectric device D is formed in both of the inside and outside of the pressure chamber Sc in plan view.

Figure 12:
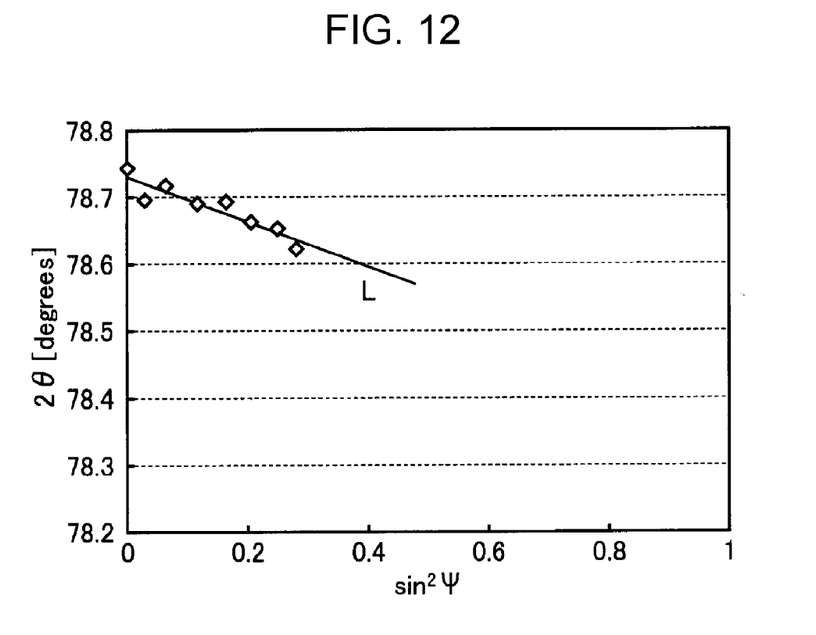
FIG. 12 is a graph of measured diffraction angles.

Specifically, an asymmetric reflection measurement was carried out using a micropart XRD measuring apparatus. That is, the diffraction angle 2θ was measured while changing the angle Ψ between the scanning surface (2θ scanning surface) and the normal to the sample surface. In the measurement of the diffraction angle 2θ, a sufficient range was secured so that the entire peak could be observed even when a peak shift occurred around the diffraction angle at which the diffraction peak of the lattice plane (301) was observed. FIG. 12 is a graph of a result obtained by measuring the relationship between the square of the sine of the angle Ψ, that is, $\sin^2\Psi$, and the diffraction angle 2θ (so-called side-inclination 2θ-$\sin^2\Psi$).

By approximating the measurement result illustrated in FIG. 12 by a straight line L, as exemplified as the measurement value M1 in FIG. 11, the diffraction angle 2θ at a lattice plane of the crystal parallel to the film surface (Ψ=0°) and a diffraction angle 2θ at a lattice plane of the crystal perpendicular to the film surface (Ψ=90°) are calculated. The measured value M2 in FIG. 11 is a numerical value obtained by converting the measured value M1 into a lattice constant with the crystal structure of the piezoelectric layer 52 being pseudo-cubic (quasi-cubic). By the above procedure, it is possible to measure the lattice constant ratio c/a or lattice spacing ratio C/A after forming the pressure chamber.

As described above, in this embodiment, the condition (0.9945≤c/a≤1.012) that the lattice constant ratio c/a or the lattice spacing ratio C/A in the crystal of the piezoelectric layer 52 is 0.9945 or more and 1.012 or less is satisfied. According to the above configuration, the polarization direction of the piezoelectric layer 52 is maintained at <111>. Therefore, compared with a configuration in which the lattice constant ratio c/a or the lattice spacing ratio C/A does not satisfy the above-mentioned conditions, it is possible to improve the performance of the piezoelectric device D. In this embodiment, in particular, the effect of improved performance of the piezoelectric layer 52 is markedly pronounced when the lattice constant ratio c/a or lattice spacing ratio C/A exceeds 0.996 (0.996<c/a, 0.996<C/A).

In addition, in this embodiment, because the thickness T of the piezoelectric device D is twice or more the thickness t of the piezoelectric layer 52 (T≥2t), the neutral plane of the piezoelectric device D is located outside the piezoelectric layer 52. Therefore, as compared with a structure in which the neutral plane is located inside the piezoelectric layer 52, it is possible to displace the piezoelectric layer 52 efficiently. In this embodiment, in particular, since the thickness T of the piezoelectric device D is equal to or less than 6 times the thickness t of the piezoelectric layer 52 (T≤6t), it is possible to reduce stress acting on the piezoelectric layer 52 (for example, stress in a state where no voltage is being applied).

Modification Examples

Each embodiment exemplified above can be variously modified. Specific modification examples that can be applied to each of the above-described embodiments are given below. Further, two or more examples arbitrarily chosen from the following examples can be combined appropriately as long as they do not contradict each other.

(1) The configuration of the piezoelectric device D is not limited to the above example. For example, the planar shape of the piezoelectric element 38 is arbitrary. Specifically, the above-described embodiment is also applicable to a configuration in which the piezoelectric element 38 is formed in a circular shape or an annular shape.

(2) A configuration (hereinafter referred to as "configuration A") in which piezoelectric devices D are formed inside and outside the pressure chamber Sc in plan view can also be adopted. The piezoelectric devices D formed on the outside of the pressure chamber Sc are actually dummy piezoelectric devices that do not contribute to ejection of ink.

Figure 13:
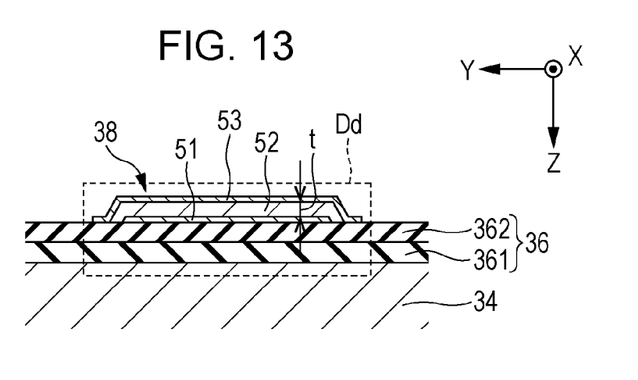
FIG. 13 is a cross-sectional view of a dummy piezoelectric device.
Figure 14:
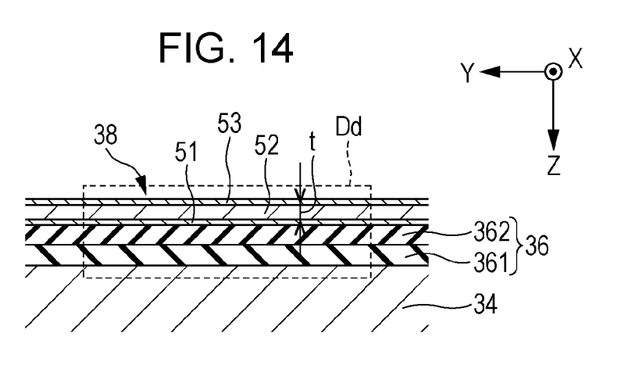
FIG. 14 is a cross-sectional view of a dummy piezoelectric device according to another embodiment.
Figure 15:
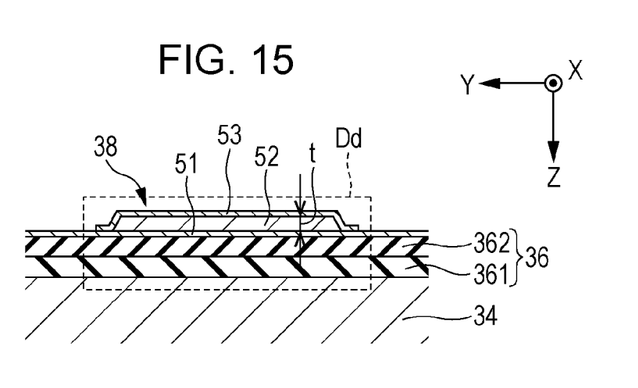
FIG. 15 is a cross-sectional view of a dummy piezoelectric device according to yet another embodiment.

For example, as illustrated in FIG. 13, the dummy piezoelectric device Dd has the same configuration as the ordinary piezoelectric device D that ejects ink from the nozzle N. However, the pressure chamber Sc is not formed below the dummy piezoelectric device Dd. Further, the configuration of the dummy piezoelectric device Dd is arbitrary. For example, as illustrated in FIG. 14, a portion where the vibration plate 36, the first electrode 51, the piezoelectric layer 52, and the second electrode 53 are stacked in a state of not being patterned (so-called solid state) also corresponds to the dummy piezoelectric device Dd. In addition, as illustrated in FIG. 15, a state in which the first electrode 51 is not patterned also corresponds to the dummy piezoelectric device Dd. Further, because the dummy piezoelectric device Dd does not actually contribute to ejection of ink, there is no problem even if the first electrode 51 and the second electrode 53 are conducting as shown in the example of FIG. 15.

In the configuration A exemplified above, the relation of the above formula (1) or formula (2) (formula (1a) or formula (2a)) holds with respect to the ordinary piezoelectric device D in which the pressure chamber Sc is formed. On the other hand, with respect to the dummy piezoelectric devices Dd illustrated in FIG. 13 to FIG. 15, it is preferable that the lattice constant ratio c/a or lattice spacing ratio C/A be 0.996 or less (c/a≤0.996, C/A≤0.996). According to the above configuration, the piezoelectric layer 52 subjected to tensile stress has a shape (shape in which A and a are increased) that is laterally stretched without opposing the tensile stress, and there is an advantage that cracks are less likely to occur.

(3) In each of the above-described embodiments, the serial type liquid ejecting apparatus 100 reciprocating the transport body 242 with the liquid ejecting head 26 mounted thereon is exemplified, but the invention is also applicable to a line type liquid ejecting apparatus in which a plurality of the nozzles N are distributed over the entire width of the medium 12. In addition, the liquid ejecting apparatus 100 exemplified in each of the above-described embodiments can be employed in various apparatuses such as a facsimile apparatus and a copying machine, in addition to an apparatus dedicated for printing.

(4) The application of the liquid ejecting apparatus of the invention is not limited to printing. For example, a liquid ejecting apparatus that ejects a solution of color materials can be used as a manufacturing device for forming the color filters of liquid crystal displays. In addition, a liquid ejecting apparatus that ejects a solution of conductive materials can be used as a manufacturing device for forming wiring or electrodes of a wiring substrate or the like. The configurations exemplified in each of the above embodiments can also be applied to a pump that conveys a solution such as a chemical liquid or the like and environmental power generation (energy harvesting) for collecting environmental energy.

What is claimed is:

1. A liquid ejecting head that ejects a liquid in a pressure chamber by a piezoelectric device,
    the piezoelectric device including
    a vibration plate,
    a piezoelectric layer containing lead,
    a first electrode provided between the vibration plate and the piezoelectric layer, and
    a second electrode provided on a side opposite to a side of the first electrode as viewed from the piezoelectric layer, wherein
    the piezoelectric layer is preferentially oriented in a (100) plane,
    a lattice constant c defined by a crystal plane of the piezoelectric layer parallel to a film surface of the piezoelectric layer and a lattice constant a defined by a crystal plane perpendicular to the film surface satisfy $0.9945 \leq c/a \leq 1.012$, and
    a thickness of the piezoelectric device is twice or more a thickness t (t<5 μm) of the piezoelectric layer.

2. The liquid ejecting head according to claim 1, wherein the lattice constant c and the lattice constant a satisfy $c/a > 0.996$.

3. A liquid ejecting apparatus comprising the liquid ejecting head according to claim 2.

4. The liquid ejecting head according to claim 1, wherein for the piezoelectric device formed outside the pressure chamber, the lattice constant c and the lattice constant a satisfy $c/a \leq 0.996$.

5. A liquid ejecting apparatus comprising the liquid ejecting head according to claim 4.

6. The liquid ejecting head according to claim 1, wherein for a portion of the piezoelectric layer located on a side opposite to a side of the pressure chamber as viewed from a neutral plane of the piezoelectric device, the lattice constant c and the lattice constant a satisfy $0.9945 \leq c/a \leq 1.012$.

7. A liquid ejecting apparatus comprising the liquid ejecting head according to claim 6.

8. The liquid ejecting head according to claim 1 wherein the thickness of the piezoelectric device is 6t or less.

9. A liquid ejecting apparatus comprising the liquid ejecting head according to claim 8.

10. The liquid ejecting head according to claim 1 wherein the vibration plate contains $ZrO_2$.

11. A liquid ejecting apparatus comprising the liquid ejecting head according to claim 10.

12. A liquid ejecting apparatus comprising the liquid ejecting head according to claim 1.

13. A liquid ejecting head that ejects a liquid in a pressure chamber by a piezoelectric device,
    the piezoelectric device including
    a vibration plate,
    a piezoelectric layer containing lead,
    a first electrode provided between the vibration plate and the piezoelectric layer, and
    a second electrode provided on a side opposite to a side of the first electrode as viewed from the piezoelectric layer, wherein
    a spacing C between lattice planes of a crystal of the piezoelectric layer parallel to a film surface of the piezoelectric layer and a spacing A between lattice planes perpendicular to the film surface satisfy $0.9945 \leq C/A \leq 1.012$, and
    a thickness of the piezoelectric device is twice or more a thickness t (t<5 μm) of the piezoelectric layer.

14. A liquid ejecting apparatus comprising the liquid ejecting head according to claim 13.

15. A piezoelectric device comprising:
    a vibration plate;
    a piezoelectric layer containing lead;
    a first electrode provided between the vibration plate and the piezoelectric layer; and
    a second electrode provided on a side opposite to a side of the first electrode as viewed from the piezoelectric layer, wherein
    the piezoelectric layer is preferentially oriented in a (100) plane,
    a lattice constant c defined by a crystal plane of the piezoelectric layer parallel to a film surface of the piezoelectric layer and a lattice constant a defined by a crystal plane perpendicular to the film surface satisfy $0.9945 \leq c/a \leq 1.012$, and
    a thickness of the piezoelectric device is twice or more a thickness t (t<5 μm) of the piezoelectric layer.

* * * * *